United States Patent [19]
Takai et al.

[11] Patent Number: 6,053,949
[45] Date of Patent: Apr. 25, 2000

[54] SIMULATOR OF LOGIC CIRCUIT AND SIMULATION METHOD

[75] Inventors: Yuji Takai; Masanobu Mizuno, both of Osaka, Japan

[73] Assignee: Matsushita Electric Industrial Co., Ltd., Osaka, Japan

[21] Appl. No.: 08/931,291

[22] Filed: Sep. 16, 1997

[30] Foreign Application Priority Data

Sep. 20, 1996 [JP] Japan .................................. 8-250127

[51] Int. Cl.[7] .................................................. G06F 17/50
[52] U.S. Cl. ............................................................ 703/15
[58] Field of Search .......................... 395/500.19; 703/15

[56] References Cited

U.S. PATENT DOCUMENTS

| | | | |
|---|---|---|---|
| 5,475,832 | 12/1995 | Shoji et al. | 703/15 |
| 5,790,830 | 8/1998 | Segal | 395/500.07 |

FOREIGN PATENT DOCUMENTS 06314311 8/1994 Japan .

*Primary Examiner*—Kevin J. Teska
*Assistant Examiner*—Hugh Jones
*Attorney, Agent, or Firm*—McDermott, Will & Emery

[57] ABSTRACT

A simulation executing unit includes a conversion unit and a simulation portion. The conversion unit includes a circuit dividing portion, a circuit converting portion and a converted logic circuit generating portion, and the circuit dividing portion divides a logic circuit into combinational partial circuits each interposed between registers or between a register and an input pin or the like. The circuit converting portion generates, on the basis of the divided combinational partial circuits, a converted logic circuit by modifying allocation of registers included in the logic circuit, so as to decrease the number of registers included in the logic circuit without changing the output timing of the logic circuit. The simulation unit performs a simulation on the converted logic circuit.

13 Claims, 15 Drawing Sheets

```
always @(posedge C L K)begin
   regX N 1 < = X N ;
   regA     < = 2 * X N ;
   regB     < = 3 * regX N 1 ;
end
always @(regA or regB)begin
   Y N < = regA + regB ;
end
```

```
always @(posedge C L K)begin
  regX N 1 < = X N ;
  regA B   < =(2*XN)+(3*regX N 1);
end always @(regA B)begin
   Y N < =regA B ;
end
```

```
always @(posedge C L K)begin
    A < = I N ;
end always @(posedge C L K)begin
    B < = A ;
end always @(posedge C L K)begin
    C < = B ;
end always @(posedge C L K)begin
    D < = C ;
end always @(D)begin
    O U T < = D ;
end
```

FIG. 10(a)

```
always @(COUNT)begin
  waddr<=COUNT%4;          /*write address generation*/
  raddr<=(COUNT+1)%4;      /*read address generation*/
end always @(posedge CLK)begin
  MEM[waddr]<=IN;
end always @(posedge CLK)begin
  OUT<=MEM[raddr];
end always @(posedge CLK)begin
  COUNT<=COUNT+1;
end
```

FIG. 10(b)

```
always @(COUNT)begin
  raddr<=COUNT+1;
end always @(posedge CLK)begin
  MEM[COUNT]<=IN;
end always @(posedge CLK)begin
  OUT<=MEM[raddr];
end always @(posedge CLK)begin
  COUNT<=COUNT+1;
end
```

Fig. 14

| PATH | CYCLE NUMBER |
|---|---|
| (A, B)-C | 2 |
| | |

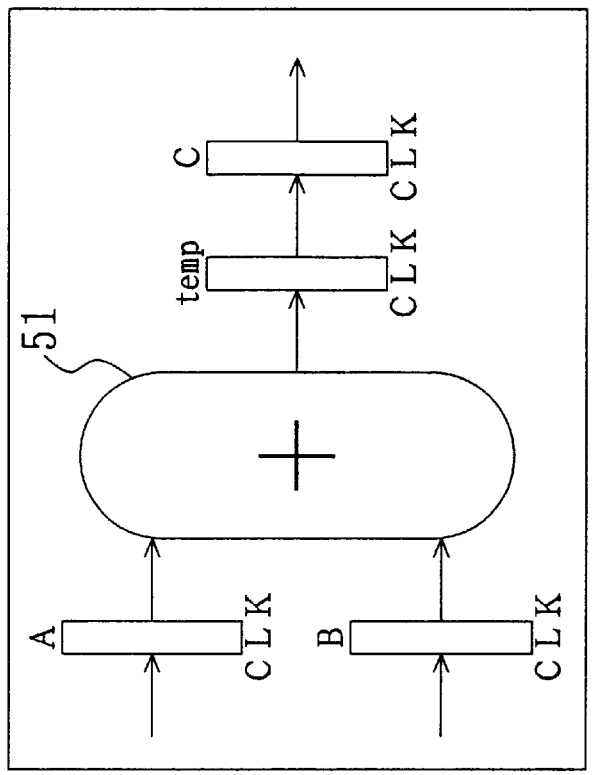
FIG. 15(c)
FIG. 15(a)
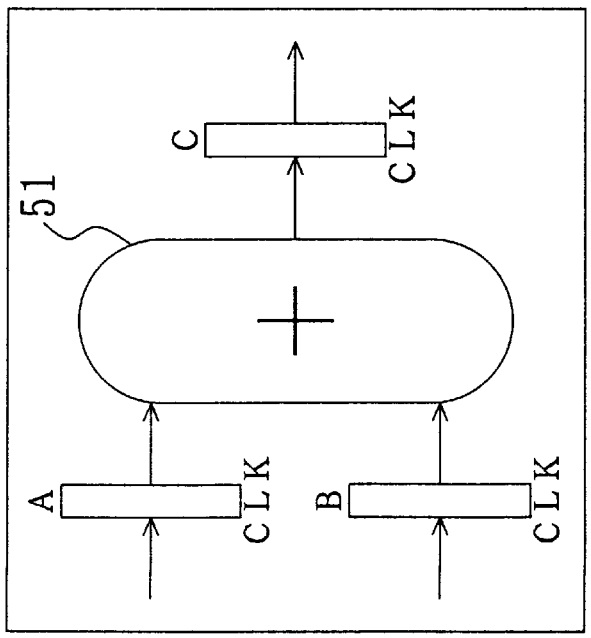
FIG. 15(d)
```
always @(posedge CLK)begin
    temp<=A+B;
    C<=temp;
end
```
FIG. 15(b)
```
always @(posedge CLK)begin
    C<=A+B;
end
```

SIMULATOR OF LOGIC CIRCUIT AND SIMULATION METHOD

BACKGROUND OF THE INVENTION

The present invention relates to a simulator and a simulation method for verifying a function or a behavior of a logic circuit.

Recently, in order to efficiently develop large-scale and complicated LSIs, the function/behavior of the LSIs are described by using a hardware description language such as VHDL and Verilog HDL or a function diagram expressed by charts and characters in designing the LSIs. Examples of widely used design methods include a simulation method in which a functional simulation or a logical simulation is carried out by using a program described by using a hardware description language or a function diagram, and a top-down design method using a logic synthesizing tool.

In a conventional simulator used in the top-down design method, however, the function/behavior of a logic circuit is processed in a simulation part with a register transfer level or the like used as one processing unit.

Specifically, when an event-driven system is adopted for the simulation, the simulator repeats the following series of processings: An updating processing of a state value of a register executed with an event registered in an event list; an event transmission processing for stacking an evaluation unit for evaluating a data transfer of a referred register on an evaluation stack; an evaluation processing for evaluating the evaluation unit stacked on the evaluation stack; and an event registration processing for registering an event in the event list when the event is newly generated from the data transfer evaluated in the evaluation processing.

Alternatively, when a cycle-based system is adopted for the simulation, the simulator carries out the following series of processings: An evaluation processing for evaluating an evaluation unit for evaluating a data transfer of a register in each clock cycle, for example, at each rise of a clock signal; and a state value updating processing for updating a state value of the register.

Such a conventional simulator has, however, the following two problems:

(1) Both the event-driven system and the cycle-based system require a longer processing time for the simulation as the number of data transfers in the logic circuit is larger. In particular, in simulating a circuit including a large number of registers such as a data path type circuit, the number of the data transfers to the respective registers is large because the number of the registers is large, and hence, the number of evaluation units is also large. As a result, a very long simulation time is required for such a circuit.

(2) In simulating a circuit including a multi-cycle path operated in accordance with plural clock cycles, the multi-cycle path is also evaluated as one clock cycle when the simulation is carried out by using a 0-delay model where a delay time is not considered. Therefore, the behavior of the multi-cycle path cannot be correctly simulated.

SUMMARY OF THE INVENTION

The present invention was devised to overcome the aforementioned conventional problems. A first object of the invention is realizing a rapid simulation of a circuit including a large number of registers, and a second object is realizing a simulation of a circuit including a multi-cycle path by using a 0-delay model.

For achieving the first object, the first simulator of this invention for use in a functional or behavioral simulation of a logic circuit and comprises converted logic circuit generating means for generating a converted logic circuit by converting a logic circuit to be simulated so as to decrease a number of data transfers executed in the logic circuit without changing an output operation timing of the logic circuit; simulation means for performing a functional or behavioral simulation on the converted logic circuit generated by the converted logic circuit generating means; and simulation substituting means for substituting a result of the simulation obtained by the simulation means for a functional or behavioral simulation of the logic circuit.

In the first simulator, the converted logic circuit is generated by converting the logic circuit so as to decrease the number of executing the data transfers in the logic circuit without changing the output operation timing of the logic circuit. Therefore, when the logic circuit has the configuration including registers, the converted logic circuit includes a smaller number of registers as compared with the original logic circuit. Accordingly, the simulation of the converted logic circuit definitely produces the same result as the simulation of the logic circuit with regard to the input/output of the circuits, and the number of data transfers executed in the simulation of the converted logic circuit is smaller than the number of data transfers executed in the simulation of the original logic circuit in accordance with the decrease of the number of the registers. As a result, the converted logic circuit can be verified in its function/behavior more rapidly than the original logic circuit. In addition, since the verification of the function/behavior of the converted logic circuit is equal to the verification of the function/behavior of the original logic circuit, time required for the design of the logic circuit can be shortened.

In the first simulator, the converted logic circuit generating means preferably includes a circuit dividing portion for dividing the logic circuit into plural combinational partial circuits each interposed between one register and an input pin, an output pin, a bisectional pin or another register; and a circuit converting portion for modifying allocation of registers so as to allocate each of the combinational partial circuits to a common register in stead of the one register. In this manner, the number of the registers in the logic circuit can be decreased, and hence, the converted logic circuit includes a smaller number of registers than the original logic circuit. As a result, since the number of executing data transfers can be decreased in accordance with the decrease of the number of the registers, the function/behavior of the logic circuit can be rapidly verified.

In the first simulator, the converted logic circuit generating means preferably includes a circuit dividing portion for dividing the logic circuit into plural combinational partial circuits each interposed between one register and an input pin, an output pin, a bidirectional pin or another register; a combinational partial circuit extracting portion for extracting, from the plural combinational partial circuits, a specific combinational partial circuit which has two or more inputs, has inputs larger in number than an output and is connected with plural registers having the same function at its inputs; and a register allocation modifying portion for erasing the plural registers connected with the specific combinational partial circuit at its inputs and for inserting a register having the same function as the plural registers to be connected with the output of the specific combinational partial circuit. In this manner, the number of the registers in the logic circuit can be definitely decreased, and hence, the converted logic circuit includes a smaller number of registers than the original logic circuit. As a result, the function/ behavior of the converted logic circuit can be definitely rapidly verified.

In the first simulator, the logic circuit preferably includes plural registers, and the converted logic circuit generating means preferably includes a partial circuit extracting portion for extracting, from the logic circuit, a partial circuit including a shift register consisting of the plural registers; and a circuit converting portion for converting the partial circuit extracted by the partial circuit extracting portion into a memory circuit including an input state value pointer for specifying a holding place for holding an input state value of the partial circuit, an output state value pointer for specifying a holding place for holding an output state value of the partial circuit and a state value holding portion for holding a state value of each of the registers of the shift register included in the partial circuit. In this manner, the partial circuit including the shift register consisting of the plural registers is extracted from the logic circuit, so as to be converted into the memory circuit including the input state value pointer, the output state value pointer and the state value holding portion. Therefore, although data are rewritten in all the registers constituting the shift register in synchronization with a clock signal in the logic circuit including the shift register, the shift operation of the shift register can be realized in the memory circuit by changing the value of the input state value pointer corresponding to the holding place for holding the input state value of the logic circuit and the value of the output state value pointer corresponding to the holding place for holding the output state value of the logic circuit. Accordingly, the data transfers can be executed in a predetermined number of times regardless of the number of steps of the shift register. As a result, even when the shift register has a large number of steps, the function/behavior of the partial circuit can be definitely rapidly verified.

In the first simulator, the logic circuit preferably includes plural registers, and the converted logic circuit generating means preferably includes a partial circuit extracting portion for extracting, from the logic circuit, a partial circuit including a shift register consisting of the plural registers; and a circuit converting portion for converting the partial circuit extracted by the partial circuit extracting portion into a memory circuit provided with a read/write control circuit which includes a memory circuit for storing an input/output state of the partial circuit, a write address generating circuit for generating a write address in the memory circuit and a read address generating circuit for generating a read address in the memory circuit. In this manner, after the partial circuit including the shift register consisting of the plural registers is extracted from the logic circuit, the partial circuit is converted into the memory circuit provided with a read/write control circuit. Thus, since the write address and the read address are independent of each other in the memory circuit provided with the read/write control circuit, the data transfers can be executed in a predetermined number of times regardless of the steps of the shift register. Therefore, even when the shift register has a large number of steps, the function/behavior of the partial circuit can be definitely rapidly verified.

In the first simulator, the write address generating circuit is preferably a counter circuit, and the read address generating circuit preferably includes the counter circuit and an increment circuit. In this manner, since the write address and the read address of the memory circuit can be definitely generated, the function/behavior of the partial circuit including the shift register can be definitely rapidly verified.

In the first simulator, the write address generating circuit and the read address generating circuit preferably include remainder calculating circuits. In this manner, even when the number of the steps of the shift register is not equal to a power of two, the function/behavior of the partial circuit including the shift register can be definitely rapidly verified.

For achieving the second object, the second simulator of this invention for use in a functional or behavioral simulation of a logic circuit including a multi-cycle path operated in accordance with plural clock cycles by using a 0-delay model where a delay time of operation is not considered, comprises converted logic circuit generating means for generating a converted logic circuit by converting the logic circuit through insertion of a register into the multi-cycle path included in the logic circuit to be simulated; simulation means for performing a functional or behavioral simulation on the converted logic circuit generated by the converted logic circuit generating means; and simulation substituting means for substituting a result of the simulation obtained by the simulation means for a functional or behavioral simulation of the logic circuit.

In the second simulator, the converted logic circuit is generated by converting the logic circuit through the insertion of the register into the multi-cycle path included in the logic circuit. Therefore, even though the simulator performs the simulation by using the 0-delay model, the multi-cycle path can be synchronized with plural clock cycles. Thus, the multi-cycle path can be accurately operated. As a result, the simulation can be correctly carried out at a predetermined timing, and hence, the function/behavior of the converted logic circuit can be correctly verified at accurate timing. Thus, the function/behavior of the converted logic circuit can be correctly verified, and hence, the function/behavior of the logic circuit can be definitely verified.

In the second simulator, the converted logic circuit generating means preferably includes a multi-cycle path extracting portion for receiving specifying data for specifying the multi-cycle path and extracting the multi-cycle path included in the logic circuit; and a register inserting portion for inserting a register into the multi-cycle path extracted by the multi-cycle path extracting portion so as to operate the multi-cycle path in accordance with a number of clock cycles specified by the specifying data. In this manner, the multi-cycle path included in the logic circuit can be definitely extracted, and additionally, the register necessary for the synchronization can be definitely inserted into the converted logic circuit. Therefore, the function/behavior of the converted logic circuit can be definitely verified.

For achieving the first object, the first simulation method of this invention for use in a functional or behavioral simulation of a logic circuit, comprising a circuit dividing step of dividing the logic circuit into plural combinational partial circuits each interposed between one register and an input pin, an output pin, a bidirectional pin or another register; a circuit converting step of modifying allocation of registers so as to allocate each of the plural combinational partial circuits to a common register instead of the one register without changing an output operation timing of the logic circuit; a converted logic circuit generating step of generating a converted logic circuit by converting the logic circuit in which the allocation of registers has been modified in the circuit converting step; a simulation step of performing a functional or behavioral simulation on the converted logic circuit generated in the converted logic circuit generating step; and a simulation substituting step of substituting a result of the simulation obtained in the simulation step for a functional or behavioral simulation of the logic circuit.

In the first simulation method, after dividing the logic circuit into the plural combinational partial circuits each interposed between one register and an input pin, an output pin, a bidirectional pin or another register, the allocation of the registers is modified so as to allocate each of the combinational partial circuits to a common register in stead of the one register without changing the output operation timing of the logic circuit. Therefore, the simulation of the converted logic circuit can definitely produce the same result as the simulation of the logic circuit with regard to the input/output of the circuits, and the number of registers included in the converted logic circuit can be smaller than that in the original logic circuit. Thus, the number of data transfers executed in the verification of the function/behavior of the converted logic circuit can be decreased in accordance with the decrease of the number of the registers. As a result, the function/behavior of the logic circuit can be rapidly verified, and the time required for the design of the logic circuit can be shortened.

For achieving the first object, the second simulation method of the invention for use in a functional or behavioral simulation of a logic circuit, comprises a circuit dividing step of dividing the logic circuit into plural combinational partial circuits each interposed between one register and an input pin, an output pin, a bidirectional pin or another register; a combinational partial circuit extracting step of extracting, from the plural combinational partial circuits, a specific combinational partial circuit which has two or more inputs, has inputs larger in number than an output and is connected with plural registers having the same function at its inputs; a register allocation modifying step of erasing the plural registers connected with the inputs of the specific combinational partial circuit and for inserting a register having the same function as the plural registers to be connected with the output of the specific combinational partial circuit; a converted logic circuit generating step of generating a converted logic circuit by converting the logic circuit in which the allocation of registers has been modified in the register allocation modifying step; a simulation step of performing a functional or behavioral simulation on the converted logic circuit generated in the converted logic circuit generating step; and a simulation substituting step of substituting a result of the simulation obtained in the simulation step for a functional or behavioral simulation of the logic circuit.

In the second simulation method, after dividing the logic circuit into the plural combinational partial circuits each interposed between one register and an input pin, an output pin, a bidirectional pin or another register and extracting a specific combinational partial circuit from the plural combinational partial circuits, the plural registers connected with the inputs of the specific combinational partial circuit are erased, and a register smaller in number than the erased registers and having the same function as the plural registers is inserted to be connected with the output of the specific combinational partial circuit. Therefore, the simulation of the converted logic circuit can definitely produce the same result as the simulation of the logic circuit, and the number of the registers in the logic circuit can be decreased. Thus, the converted logic circuit includes a smaller number of registers than the original logic circuit. As a result, since the number of data transfers executed in the verification of the function/behavior of the converted logic circuit is decreased in accordance with the decrease of the number of the registers, the function/behavior of the logic circuit can be rapidly verified. Thus, the time required for the design of the logic circuit can be shortened.

For achieving the first object, the third simulation method of this invention for use in a functional or behavioral simulation of a logic circuit including a shift register consisting of plural registers, comprises a partial circuit extracting step of extracting, from the logic circuit to be simulated, a partial circuit including the shift register consisting of the plural registers; a circuit converting step of converting the partial circuit extracted in the partial circuit extracting step into a memory circuit provided with a read/write control circuit which includes a memory circuit for storing an input/output state of the partial circuit, a write address generating circuit for generating a write address in the memory circuit and a read address generating circuit for generating a read address in the memory circuit; a converted logic circuit generating step of generating a converted logic circuit by converting the logic circuit on the basis of the memory circuit provided with a read/write control circuit obtained in the circuit converting step; a simulation step of performing a functional or behavioral simulation on the converted logic circuit generated in the converted logic circuit generating step; and a simulation substituting step of substituting a result of the simulation obtained in the simulation step for a functional or behavioral simulation of the logic circuit.

In the third simulation method, after extracting the partial circuit including the shift register consisting of the plural register from the logic circuit, the partial circuit is converted into the memory circuit provided with a read/write control circuit. Therefore, although data are rewritten in all the registers included in the shift register in synchronization with a clock signal in the logic circuit including the shift register, since a write address and a read address can be independently generated in the memory circuit provided with a read/write control circuit, the data transfers can be executed in a predetermined number of times regardless of the number of steps of the shift register. As a result, the function/behavior of the converted logic circuit can be rapidly verified, and hence, the time required for the design of the logic circuit can be shortened.

For achieving the second object, the fourth simulation method of this invention for use in a functional or behavioral simulation of a logic circuit including a multi-cycle path operated in accordance with plural clock cycles by using a 0-delay model where a delay time of operation is not considered, comprises a multi-cycle path extracting step of extracting the multi-cycle path of the logic circuit to be simulated by using specifying data for specifying the multi-cycle path; a register inserting step of inserting, into the multi-cycle path extracted in the multi-cycle path extracting step, registers in a number necessary for operating the multi-cycle path in accordance with a number of clock cycles specified by the specifying data; a converted logic circuit generating step of generating a converted logic circuit by converting the logic circuit on the basis of the multi-cycle path into which the registers have been inserted in the register inserting step; a simulation step of performing a functional or behavioral simulation on the converted logic circuit generated in the converted logic circuit generating step; and a simulation substituting step of substituting a result of the simulation obtained in the simulation step for a functional or behavioral simulation of the logic circuit.

In the fourth simulation method, the converted logic circuit is generated by converting the logic circuit through the insertion of a register into the multi-cycle path included in the logic circuit. Therefore, even though the simulation is performed by using the 0-delay model in the simulation method, the multi-cycle path can be synchronized with plural clock cycles. Thus, the operation of the multi-cycle path can be correctly simulated at a predetermined timing,

BRIEF DESCRIPTION OF THE DRAWINGS

FIGS. 4(a) and 4(b) illustrate a specific example of a logic circuit input to the converted logic circuit generating means of the simulator of the first embodiment, wherein FIG. 4(a) is a circuit diagram of the logic circuit and FIG. 4(b) is a program list described by using a hardware description language;

FIGS. 5(a) and 5(b) illustrate a specific example of a converted logic circuit output by the converted logic circuit generating means of the simulator of the first embodiment, wherein FIG. 5(a) is a circuit diagram of the converted logic circuit and FIG. 5(b) is a program list described by using the hardware description language;

FIGS. 8(a) and 8(b) illustrate a specific example of a logic circuit including a shift register, extracted by converted logic circuit generating means of the simulator of the second embodiment, wherein FIG. 8(a) is a circuit diagram of the logic circuit and FIG. 8(b) is a program list described by using the hardware description language;

FIGS. 10(a) and 10(b) illustrate a specific example of the memory circuit provided with the read/write control circuit output by the converted logic circuit generating means of the simulator of the second embodiment, wherein FIG. 10(a) is a program list, described by using the hardware description language, of the memory circuit including a remainder calculating circuit and FIG. 10(b) is a program list, described by using the hardware description language, of the memory circuit not including a remainder calculating circuit;

FIG. 14 is a diagram of a multi-cycle path specifying data table used in the simulator of the third embodiment; and FIGS. 15(a) through 15(d) illustrate a specific example of a multi-cycle path extracted by converted logic circuit generating means of the simulator of the third embodiment, wherein FIG. 15(a) is a circuit diagram of a logic circuit having the multi-cycle path, FIG. 15(b) is a program list, described by using the hardware description language, of the logic circuit, FIG. 15(c) is a circuit diagram of a converted logic circuit having the multi-cycle path and FIG. 15(d) is a program list, described by using the hardware description language, of the converted logic circuit.

DETAILED DESCRIPTION OF THE INVENTION (Embodiment 1)

A first embodiment of the invention will now be described with reference to the accompanying drawings.

Figure 1:
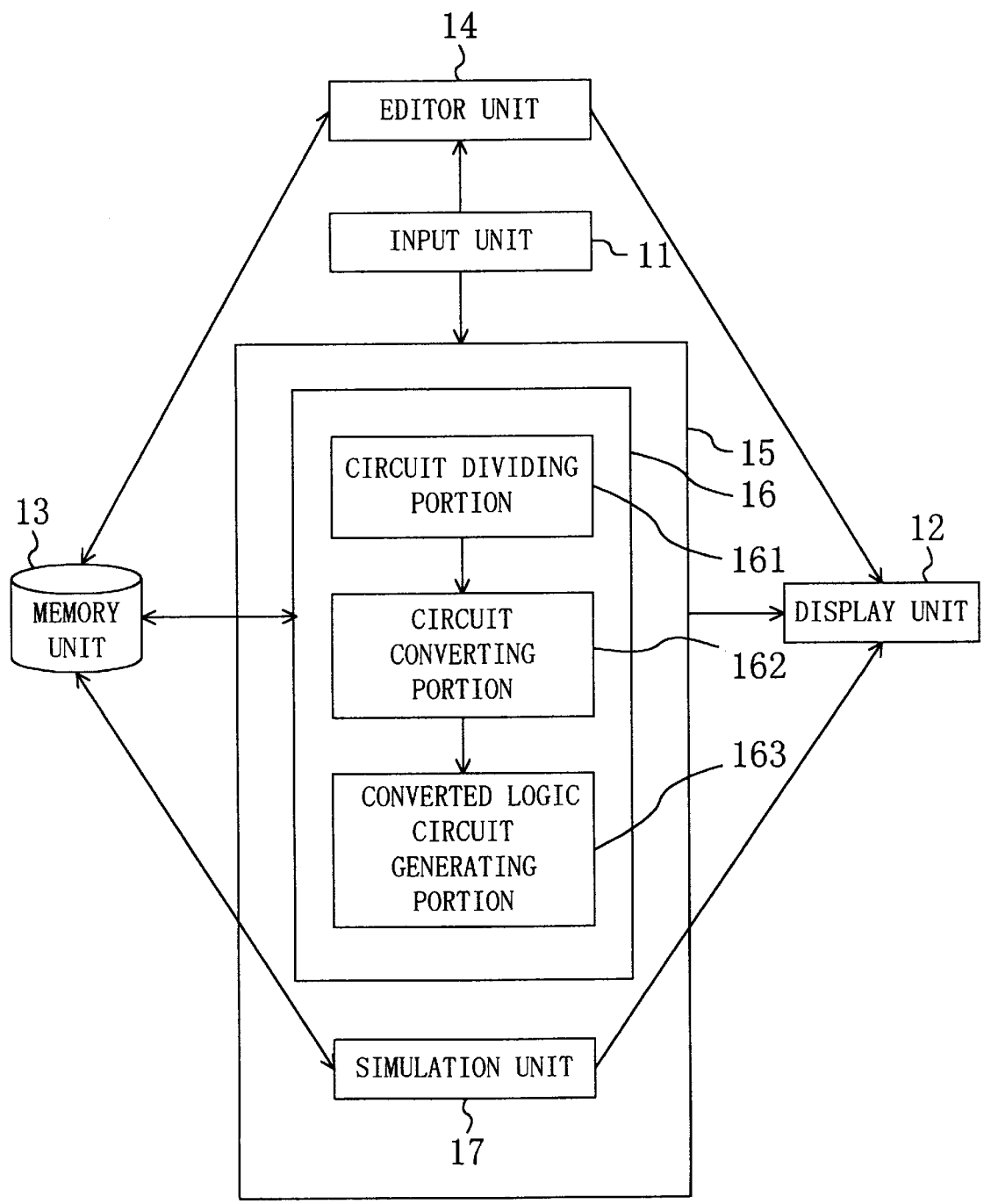
FIG. 1 is a diagram for showing the block configuration of a simulator according to a first embodiment of the invention.

FIG. 1 is a block diagram of a simulator according to the first embodiment. In FIG. 1, a reference numeral 11 denotes an input unit for externally inputting desired data, a reference numeral 12 denotes a display unit for displaying various data, a reference numeral 13 denotes a memory unit for storing design data and the like of a logic circuit, a reference numeral 14 denotes an editor unit having a function to describe, in the display unit 12, a function/behavior of the logic circuit to be simulated including an input pin, an output pin, a bidirectional pin or a register by using a hardware description language or a function diagram, a function to store, in the memory unit 13, the described data of the logic circuit as logic circuit data, and a function to read the logic circuit data from the memory unit 13 and display the read data in the display unit 12, and a reference numeral 15 denotes a simulation executing unit including a conversion unit 16 working as converted logic circuit generating means and a simulation unit 17 working as simulation means.

The conversion unit 16 includes a circuit dividing portion 161, a circuit converting portion 162 and a converted logic circuit generating portion 163.

The circuit dividing portion 161 has a function to detect description errors in the logic circuit data read from the memory unit 13 and described by the editor unit 14, and has a function to retrieve, from the logic circuit, combinational partial circuits each interposed between registers, between a register and an output pin, between a register and a bidirectional pin, between an input pin and a register, between an input pin and an output pin, between an input pin and a bidirectional pin, between bidirectional pins, or between a bidirectional pin and an output pin, so that the logic circuit can be divided into the respective combinational partial circuits. At this point, a description error can be a grammatical error, an inequality error in a bit width, an error of uncompleted description, and the like.

The circuit converting portion 162 has a re-timing function to modify, on the basis of the combinational partial circuits divided by the circuit dividing portion 161, allocation of the registers included in the logic circuit so as to decrease the number thereof without changing the output operation timing of the logic circuit, and a function to display data on the modification of the allocation of the registers in the display unit 12.

The converted logic circuit generating portion 163 has a function to generate a converted logic circuit by converting the logic circuit having been subjected to the re-timing processing by the circuit converting portion 162, and a function to store logic circuit data of the converted logic circuit in the memory unit 13.

The simulation unit 17 has a function to perform a simulation on the converted logic circuit generated by the conversion unit 16 with the logic circuit data of the converted logic circuit received from the memory unit 13, a function to display the result of the simulation in the display unit 12, and a function to store the result of the simulation in the memory unit 13.

Although this simulator includes simulation substituting means for substituting the simulation result of the converted logic circuit for the simulation of the function/behavior of the logic circuit to be simulated, the simulation substituting means is not shown in FIG. 1 because the simulation result of the converted logic circuit can be simply mapped in the simulation result of the original logic circuit in this embodiment. Furthermore, the simulation system adopted by the simulation unit 17 can be the event-driven system or the cycle-based system.

Now, a simulation method by using the simulator having the aforementioned configuration will be described.

Figure 2:
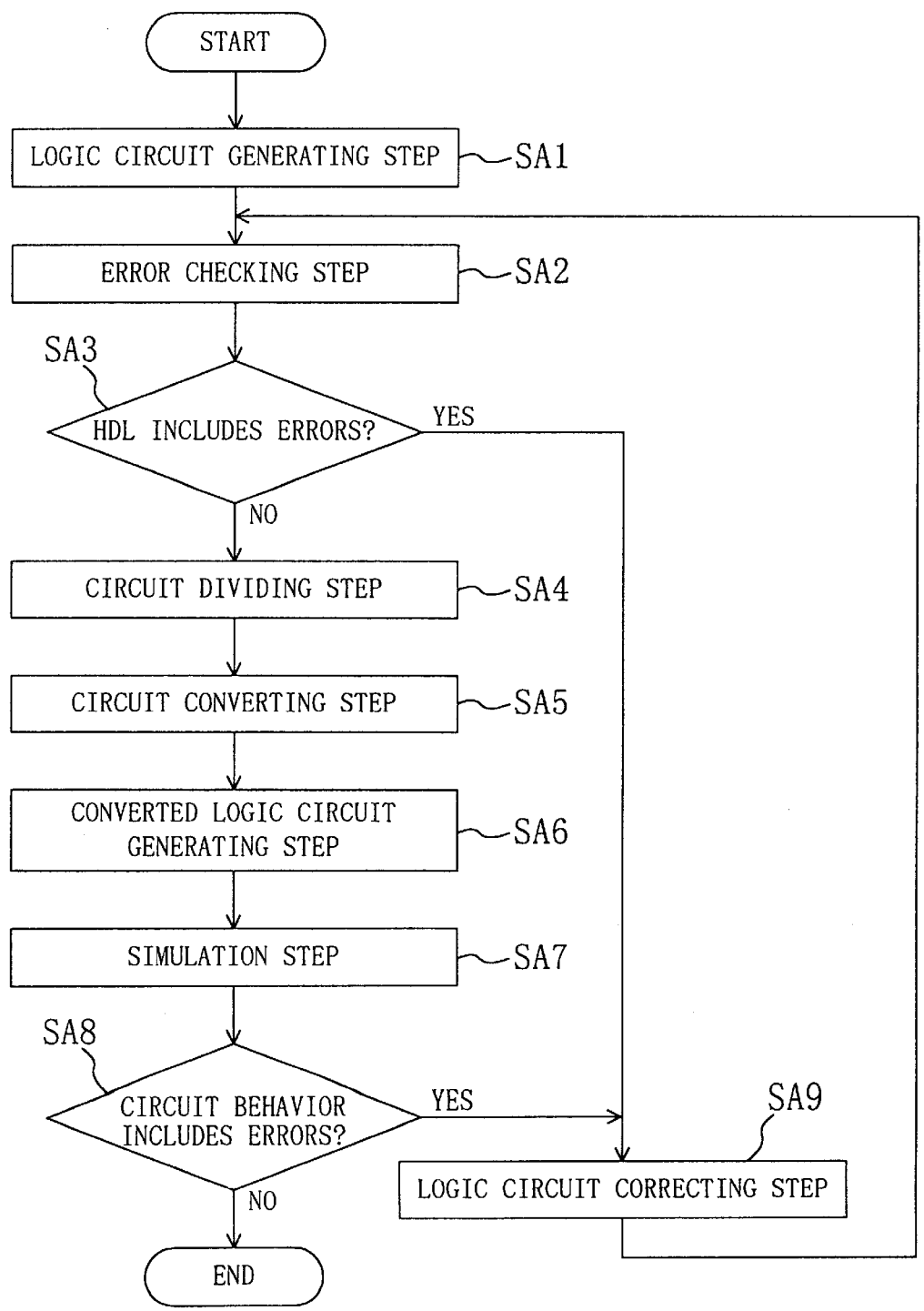
FIG. 2 is a flowchart for showing a simulation method using the simulator of the first embodiment.

FIG. 2 is a flowchart for showing the simulation method by using the simulator of the first embodiment.

First, as is shown in FIG. 2, in a logic circuit generating step SA1, the editor unit 14 of FIG. 1 describes the function/behavior of the logic circuit to be simulated, by using the hardware description language or the function diagram, thereby generating the logic circuit data of the logic circuit.

Then, in an error checking step SA2, the circuit dividing portion 161 detects description errors in the logic circuit data of the logic circuit generated in the logic circuit generating step SA1.

Next, in a description error judging step SA3, it is determined whether or not the logic circuit data includes any error. When there is no error, the procedure proceeds to a circuit dividing step SA4. When there is an error, the procedure proceeds to a logic circuit correcting step SA9, in which the logic circuit or the logic circuit data thereof is corrected in the editor unit 14, and the procedure returns to the error checking step SA2.

Subsequently, in the circuit dividing step SA4, the circuit dividing portion 161 divides the logic circuit into the combinational partial circuits each interposed between registers, between a register and an output pin, between a register and a bidirectional pin, between an input pin and a register, between an input pin and an output pin, between an input pin and a bidirectional pin, between bidirectional pins or between a bidirectional pin and an output pin.

Then, in a circuit converting step SA5, the circuit converting portion 162 conducts the re-timing processing, on the basis of the logic circuit data of the logic circuit divided by the circuit dividing portion 161, for modifying the allocation of the registers included in the logic circuit so as to decrease the number of the registers without changing the output operation timing of the logic circuit from that of the original logic circuit.

Next, in a converted logic circuit generating step SA6, the converted logic circuit generating portion 163 generates the converted logic circuit from the logic circuit having been subjected to the re-timing processing by the circuit converting portion 162.

Next, in a simulation step SA7, the simulation unit 17 simulates the converted logic circuit generated by the converted logic circuit generating portion 163, thereby verifying the function of the converted logic circuit.

Then, in a behavior error judging step SA8, it is determined whether or not the behavior of the converted logic circuit includes any error, and when no error is found, the simulation is completed. When any error is found, the converted logic circuit or the logic circuit data thereof is corrected in the logic circuit correcting step SA9, and the procedure returns to the error checking step SA2.

When the logic circuit has a description error or when the function or behavior of the converted logic circuit includes an error, the procedures in the steps SA2 through SA9 are repeatedly executed.

It is noted that test patterns for the simulation used in the simulation step SA7 are assumed to have no error. If the test patterns have any error, the test patterns are required to be corrected.

Furthermore, as described with regard to the configuration of the simulator of this embodiment, description of a simulation substituting step of substituting the simulation result of the converted logic circuit for the simulation of the function/behavior of the logic circuit to be simulated is herein omitted.

Figure 3:
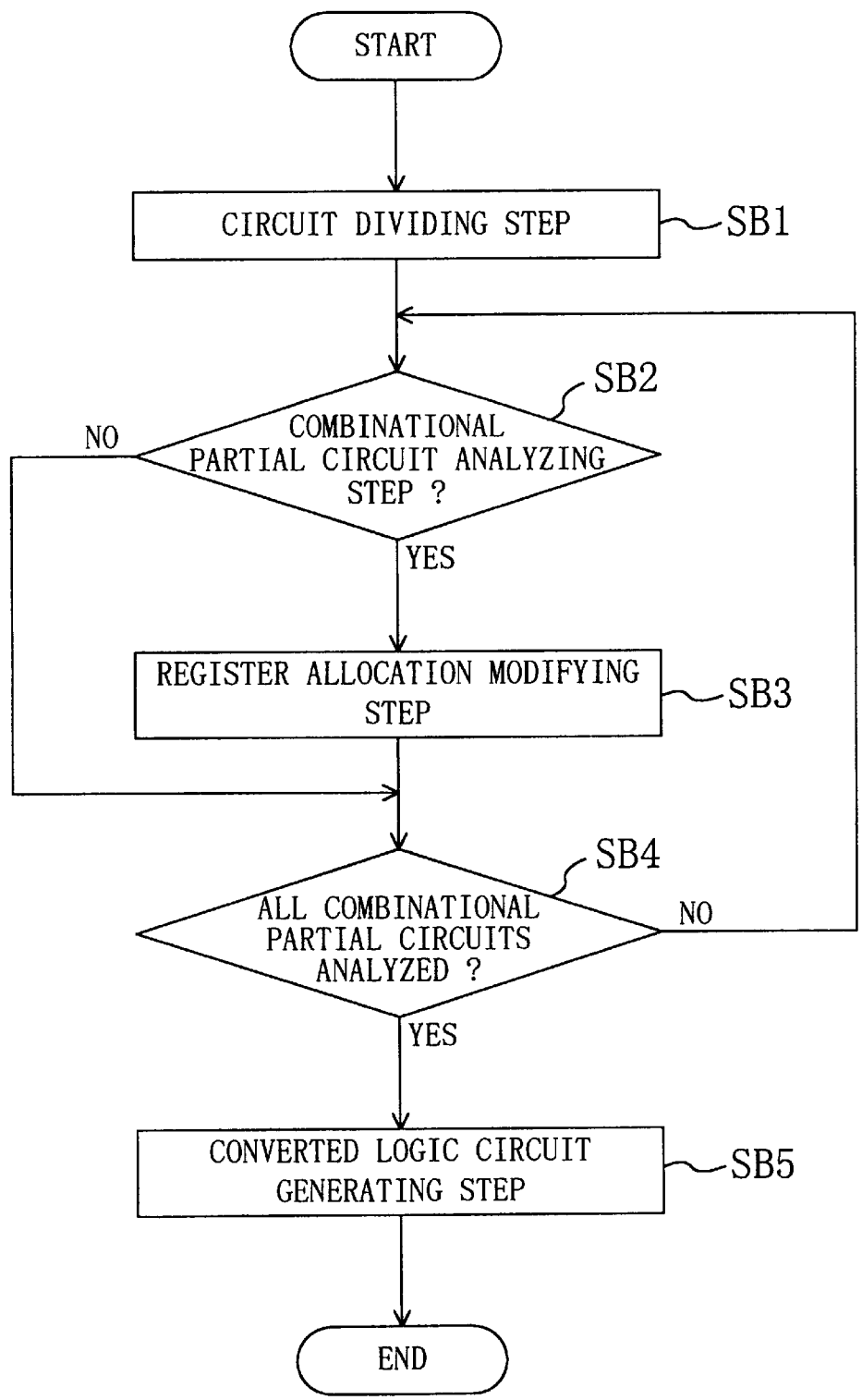
FIG. 3 is a flowchart for showing a method of modifying allocation of a register in a logic circuit adopted by converted logic circuit generating means of the simulator of the first embodiment.

Now, an example of the modification of the allocation of the registers included in the logic circuit by the conversion unit 16 will be described with reference to a flowchart of FIG. 3.

At this point, the circuit converting portion 162 includes a combinational partial circuit analyzing portion for extracting a specific combinational partial circuit and a register allocation modifying portion.

First, in a circuit dividing step SB1, the circuit dividing portion 161 divides the logic circuit to be simulated into the combinational partial circuits each interposed between registers, between a register and an output pin, between a register and a bidirectional pin, between an input pin and a register, between an input pin and an output pin, between an input pin and a bidirectional pin, between bidirectional pins or between a bidirectional pin and an output pin.

Then, in a combinational partial circuit analyzing step SB2, the combinational partial circuit analyzing portion of the circuit converting portion 162 determines whether or not any of the combinational partial circuits divided by the circuit dividing portion 161 has two or more inputs, has inputs larger in number than an output thereof and includes registers, having the same function and in synchronization with the same clock, connected with all the inputs thereof. When such a combinational partial circuit is not found, the procedure proceeds to an analysis completion judging step SB4. When such a combinational partial circuit is found, the procedure proceeds to a register allocation modifying step SB3.

Next, in the register allocation modifying step SB3, the register allocation modifying portion of the circuit converting portion 162 erases all the registers disposed at the inputs of the combinational partial circuit and inserts a register having the same function as the erased registers at the output of the combinational partial circuit.

Then, in the analysis completion judging step SB4, the circuit converting portion 162 determines whether or not all the combinational partial circuits have been analyzed by the combinational partial circuit analyzing portion. When all the combinational partial circuits have been analyzed, the procedure proceeds to a converted logic circuit generating step SB5. When all the combinational partial circuits have not been analyzed, the procedure returns to the combinational partial circuit analyzing step SB2, so that the procedures in the steps SB2 through SB4 are successively repeated until all the combinational partial circuits are analyzed.

Next, in the converted logic circuit generating step SB5, the converted logic circuit generating portion 163 generates the converted logic circuit from the logic circuit in which the allocation of the registers has been modified.

Now, specific examples of the logic circuit input to the conversion unit 16 and the converted logic circuit converted by the conversion unit 16 will be described with reference to FIGS. 4(*a*) and 5(*a*).

Figures 4A, 4B:
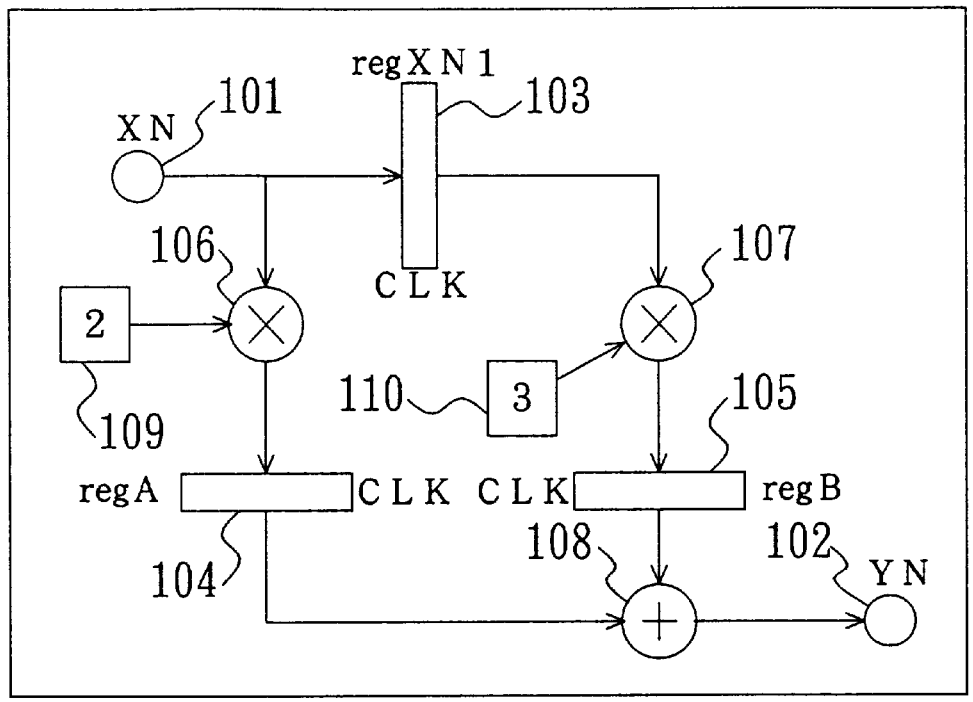

FIG. 4(*a*) is a circuit diagram of the logic circuit input to the conversion unit 16 described by using the function diagram. In FIG. 4(a), XN(101) indicates an input pin of the logic circuit, YN(102) indicates an output pin of the logic circuit, regXN1(103), regA(104) and regB(105) respectively indicate registers for storing input data in synchronization with a clock CLK, reference numerals 106 and 107 denotes multipliers, a reference numeral 108 denotes an adder, and reference numerals 109 and 110 denotes constants. Furthermore, a combination of the multiplier 106 and the constant 109, a combination of the multiplier 107 and the constant 110, and the adder 108 are the combinational partial circuits divided by the circuit dividing portion 161. FIG. 4(b) is a program list for the simulation of the logic circuit of FIG. 4(a) described by using the hardware description language.

Figures 5A, 5B:
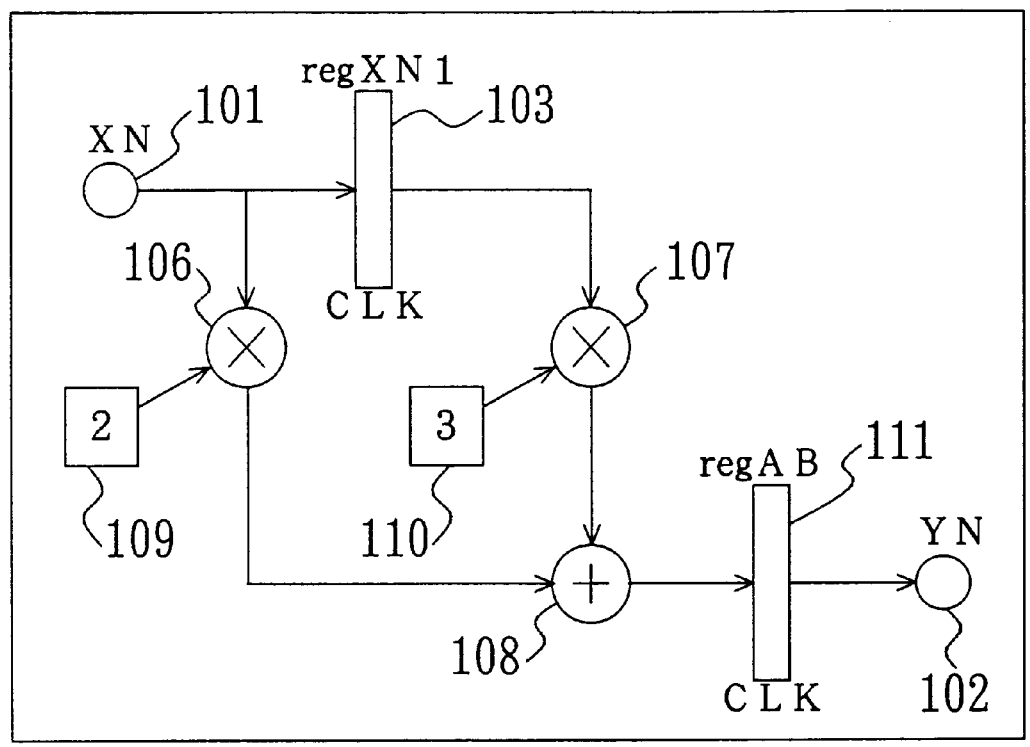

FIG. 5(a) is a circuit diagram of the converted logic circuit generated by the conversion unit 16 described by using the function diagram. In FIG. 5(a), a reference numeral 111 denotes a register generated through the re-timing processing on the adder 108 by the conversion unit 16.

Specifically, the combinational partial circuit including the adder 108 has two inputs, has one output, which is larger in number than the inputs, and the inputs are connected with the registers regA(104) and regB(105) having the same function and synchronized with the same clock. Therefore, when the registers regA(104) and regB(105) are moved and replaced with one register regAB(111) connected with the output of the adder 108, the output operation timing of the logic circuit cannot be changed. Accordingly, the circuit converting portion 162 erases the registers regA(104) and regB(105), and inserts the register regAB(111) having the same function as the registers regA(104) and regB(105) to be connected with the output of the adder 108. FIG. 5(b) is a program list for the simulation of the converted logic circuit of FIG. 5(a) described by using the hardware description language. The hardware description language used herein is the Verilog HDL.

When the logic circuit shown in FIGS. 4(a) and 4(b) is compared with the converted logic circuit converted by the conversion unit 16 shown in FIGS. 5(a) and 5(b), the converted logic circuit includes a smaller number of registers. Therefore, the number of executing times of data transfers to the registers is decreased in accordance with the decrease of the number of the registers, and hence, the number of the executing times of data transfers in the entire converted logic circuit is decreased. As a result, the simulation by the simulation unit 17 can be executed rapidly.

In this manner, after the converted logic circuit having the same behavior as the logic circuit to be simulated and including a smaller number of registers is generated by the conversion unit 16, the simulation is carried out on the generated converted logic circuit. Thus, the simulation can be executed at a higher speed as compared with the simulation of the original logic circuit. As a result, the function/behavior of the logic circuit can be rapidly verified, and hence, time required for designing the logic circuit can be shortened.

(Embodiment 2)

A second embodiment of the invention will now be described with reference to the accompanying drawings.

Figure 6:
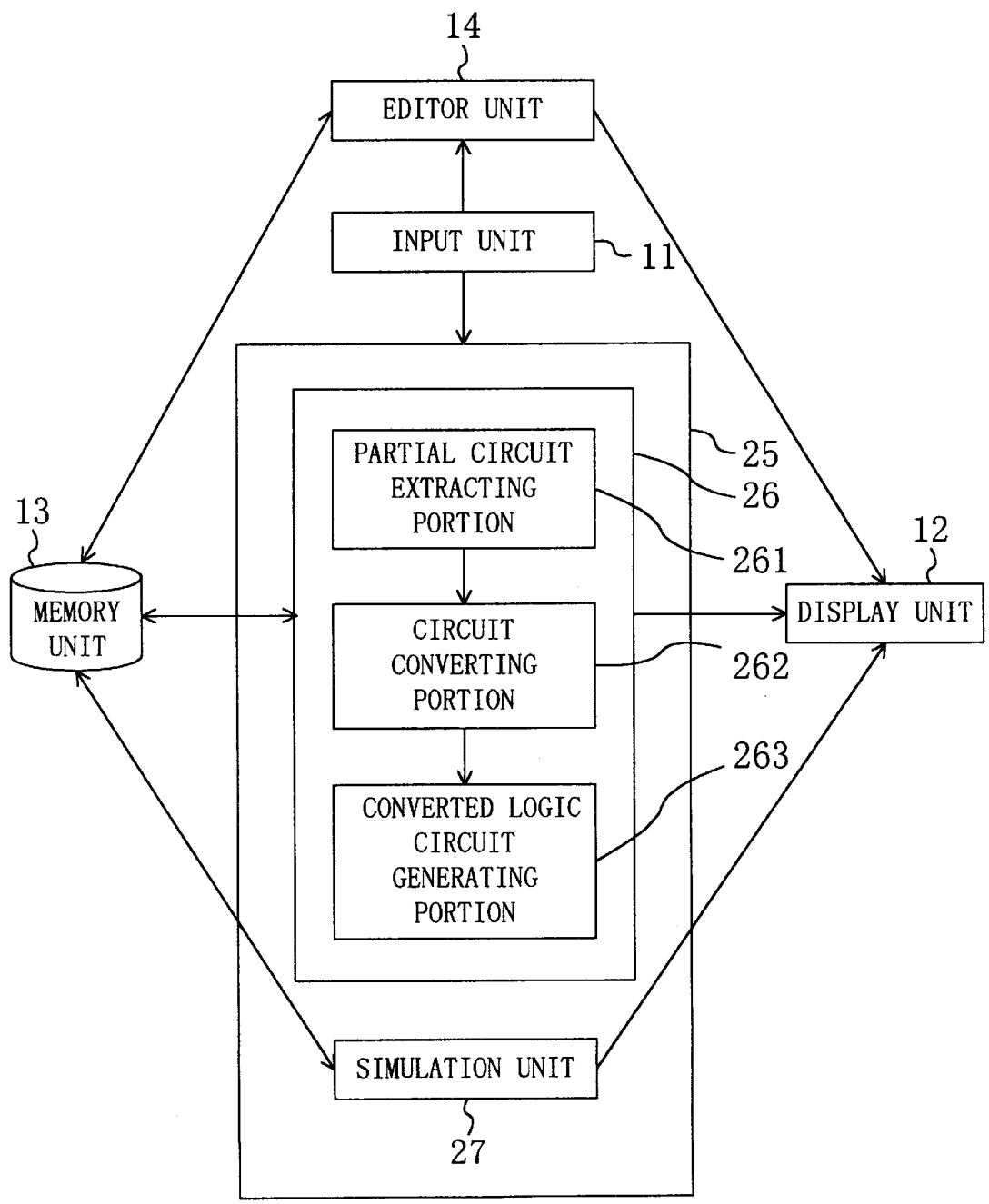
FIG. 6 is a diagram for showing the block configuration of a simulator according to a second embodiment of the invention.

FIG. 6 is a block diagram of a simulator according to the second embodiment. In FIG. 6, a reference numeral 11 denotes an input unit for externally inputting desired data, a reference numeral 12 denotes a display unit for displaying various data, a reference numeral 13 denotes a memory unit for storing design data and the like of a logic circuit, a reference numeral 14 denotes an editor unit having a function to describe, in the display unit 12, the function/behavior of the logic circuit to be simulated including plural registers by using a hardware description language or a function diagram, a function to store the described data of the logic circuit in the memory unit 13 as logic circuit data, and a function to read the logic circuit data from the memory unit 13 and display the read data in the display unit 12, and a reference numeral 25 denotes a simulation executing unit including a conversion unit 26 working as converted logic circuit generating means and a simulation unit 27 working as simulation means.

The conversion unit 26 includes a partial circuit extracting portion 261, a circuit converting portion 262 and a converted logic circuit generating portion 263.

The partial circuit extracting portion 261 has a function to detect a description error in the logic circuit data read from the memory unit 13 and described by the editor unit 14, and a function to extract a partial circuit including registers constituting a shift register from the logic circuit. At this point, a description error can be a grammatical error, an inequality error in a bit width, an error of uncompleted description, and the like.

The circuit converting portion 262 has a function to convert the partial circuit including the shift register extracted by the partial circuit extracting portion 261 into a memory circuit provided with a read/write control circuit, which is described in detail below, and a function to display data on the circuit conversion in the display unit 12. In the behavior model of the memory circuit provided with the read/write control circuit, when the circuit including the shift register to be converted holds input data in synchronization with a rise of a clock CLK, data are write in or read from the memory circuit provided with the read/write control circuit in synchronization with a rise of a clock CLK.

The converted logic circuit generating portion 263 has a function to newly generate a converted logic circuit in which the partial circuit including the shift register has been converted into the memory circuit provided with the read/write control circuit by the circuit converting portion 262, and a function to store the generated converted logic circuit in the memory unit 13.

The simulation unit 27 has a function to perform a simulation on the converted logic circuit with the logic circuit data of the converted logic circuit generated through conversion by the conversion unit 26 received from the memory unit 13, a function to display the result of the simulation in the display unit 12 and a function to store the simulation result in the memory unit 13.

Although the simulator of this embodiment further includes simulation substituting means for substituting the simulation result of the converted logic circuit for a simulation of the function/behavior of the logic circuit to be simulated, the simulation substituting means is not shown in the drawing because the simulation result of the converted logic circuit can be simply mapped in the simulation result of the original logic circuit in this embodiment. Furthermore, the simulation system adopted by the simulation unit 27 can be the eventdriven system or the cycle-based system.

Now, a simulation method by using the simulator having the aforementioned configuration will be described.

Figure 7:
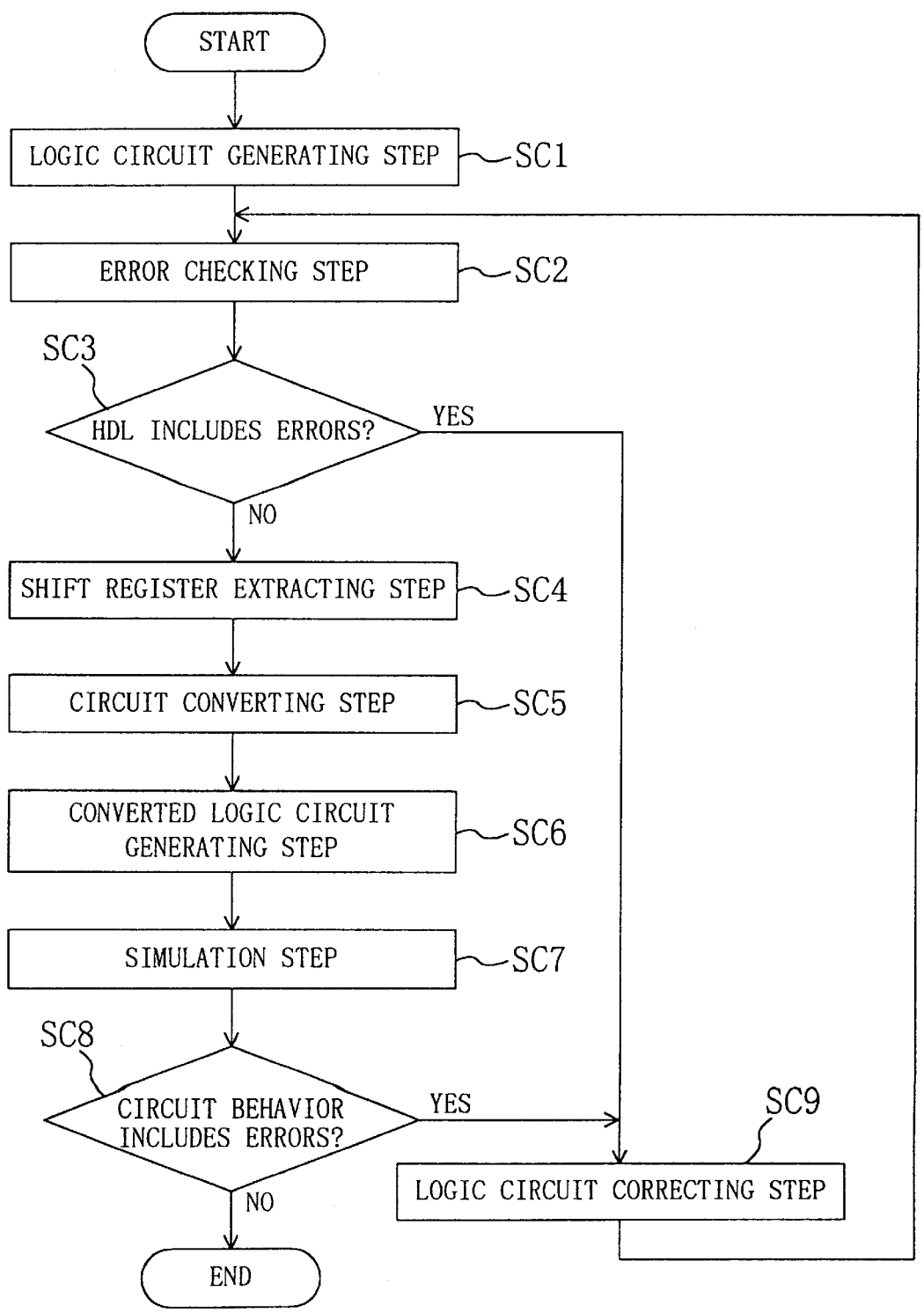
FIG. 7 is a flowchart for showing a simulation method using the simulator of the second embodiment.

FIG. 7 is a flowchart for showing the simulation method by using the simulator according to the second embodiment.

First, as is shown in FIG. 7, in a logic circuit generating step SC1, the editor unit 14 of FIG. 6 describes the function/behavior of the logic circuit to be simulated by using the hardware description language or the function diagram, thereby generating the logic circuit data of the logic circuit.

Next, in an error checking step SC2, the partial circuit extracting portion 261 detects description errors in the logic circuit data of the logic circuit generated in the logic circuit generating step SC1.

Then, in a description error judging step SC3, it is determined whether or not the logic circuit data includes any error, and when there is no error, the procedure proceeds to a shift register circuit extracting step SC4. When there is an error, the procedure proceeds to a logic circuit correcting step SC9, in which the logic circuit or the logic circuit data thereof is corrected by the editor unit 14, and the procedure returns to the error checking step SC2.

Subsequently, in the shift register circuit extracting step SC4, the partial circuit extracting portion 261 extracts a partial circuit including a shift register circuit from the logic circuit.

Then, in a circuit converting step SC5, the circuit converting portion 262 converts the partial circuit including the shift register circuit extracted by the partial circuit extracting portion 261 into the memory circuit provided with the read/write control circuit, which includes a memory circuit for storing an input/output state of the partial circuit, a write address generating circuit for generating a write address in the memory circuit and a read address generating circuit for generating a read address in the memory circuit.

Next, in a converted logic circuit generating step SC6, the converted logic circuit generating portion 263 generates the converted logic circuit from the logic circuit in which the partial circuit including the shift register circuit has been converted into the memory circuit provided with the read/write control circuit.

Then, in a simulation step SC7, the simulation unit 27 carries out the simulation on the converted logic circuit generated by the converted logic circuit generating portion 263, thereby verifying the function of the converted logic circuit.

Subsequently, in a behavior error judging step SC8, it is determined whether or not the behavior of the converted logic circuit includes any error, and when there is no error, the simulation is completed. When there is an error, the converted logic circuit or the logic circuit data thereof is corrected in the logic circuit correcting step SC9, and the procedure returns to the error checking step SC2.

When the logic circuit has a description error or when the function/behavior of the converted logic circuit includes an error, the procedures in the steps SC2 through SC9 are successively repeated.

Test patterns used for the simulation in the simulation step SC7 are assumed to include no error. If the test patterns include any error, the test patterns are required to be corrected.

Furthermore, as described with regard to the configuration of the simulator of this embodiment, description of a simulation substituting step of substituting the simulation result of the converted logic circuit for the simulation of the function/behavior of the logic circuit to be simulated is herein omitted.

Now, the conversion of the partial circuit including the shift register and included in the logic circuit into the memory circuit provided with the read/write control circuit by the conversion unit 26 will be specifically described.

Figures 8A, 8B:
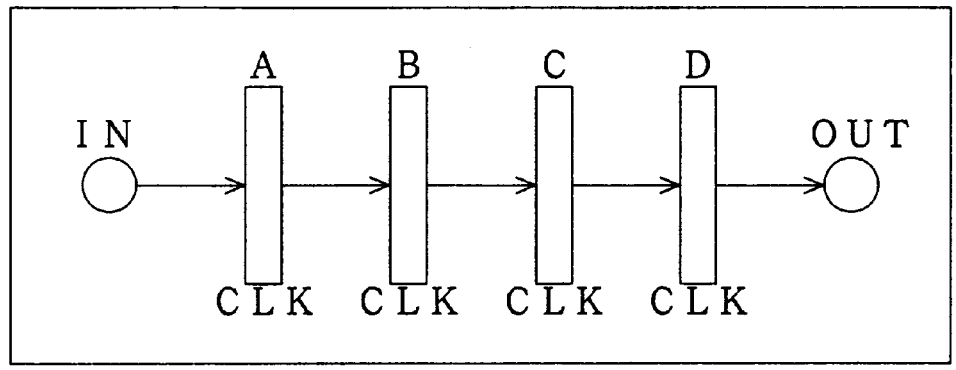

FIG. 8(a) is an exemplified circuit diagram of a partial circuit, including a shift register consisting of plural registers, extracted by the partial circuit extracting portion 261, described by using the function diagram. In FIG. 8(a), IN indicates an input pin of the partial circuit, OUT indicates an output pin of the partial circuit, and A, B, C and D indicate registers for holding input data in synchronization with a clock CLK. When a clock CLK is input, the data having been input to the input pin IN is first input to the register A, and when a subsequent clock CLK is input, the data held by the register A is input to the register B. In other words, every time a clock CLK is input, the data having been input to the input pin IN is moved, by one register at a time, in the direction from the register A to the register D toward the output pin OUT. FIG. 8(b) is a program list for the simulation of the partial circuit of FIG. 8(a) described by using the hardware description language.

Figure 9:
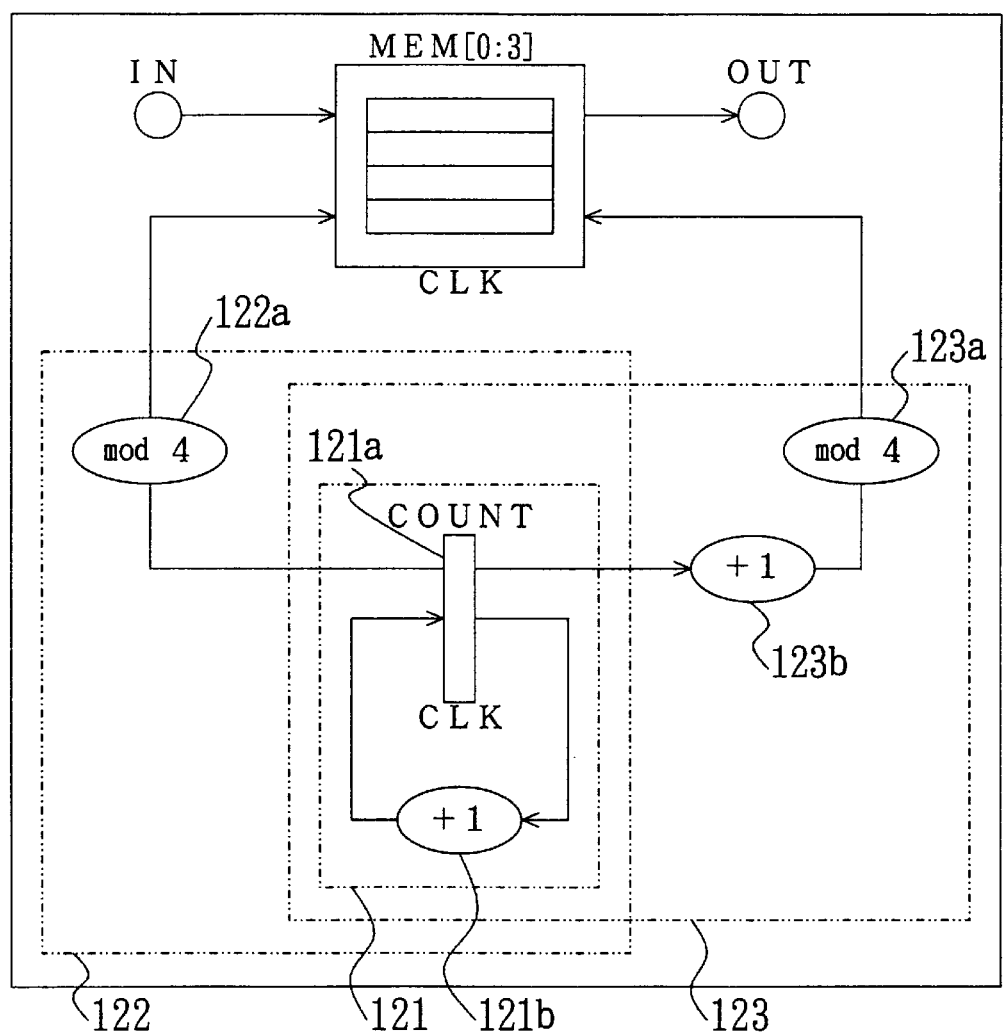
FIG. 9 is a circuit diagram of a specific example of a memory circuit provided with a read/write control circuit, output by the converted logic circuit generating means of the simulator of the second embodiment.

FIG. 9 is an exemplified circuit diagram, described by using the function diagram, in which the partial circuit including the shift register consisting of four registers as is shown in FIG. 8(a) has been converted into a memory circuit provided with a read/write control circuit by the conversion unit 26. In FIG. 9, MEM indicates a memory circuit of four words working as a state value storing portion. In the behavior model of the memory circuit MEM, it is premised that a data is write in or read from the memory circuit MEM synchronously with a rise of a clock CLK.

The word number of the memory circuit MEM can be any number as far as it exceeds the number of the registers constituting the shift register. In this embodiment, the number of the shift registers is four, and hence the word number of the memory circuit MEM is four.

Also in FIG. 9, a reference numeral 121 denotes a counter circuit including a register COUNT(121a) for storing a count value and an increment circuit 121b for adding one to the state value held by the register COUNT(121a) at every entry of a clock CLK and outputting the result of the addition. The counter circuit 121 is used to generate an address for accessing the memory circuit MEM.

A reference numeral 122 denotes a write address generating circuit, working as an input state value pointer, for generating a write address in the memory circuit MEM. The write address generating circuit 122 includes a remainder calculating circuit 122a connected between the counter circuit 121 and the memory circuit MEM, and the counter circuit 121. The remainder calculating circuit 122a generates and outputs a remainder obtained by dividing one output state value of the counter circuit 121 by four.

A reference numeral 123 denotes a read address generating circuit, working as an output state value pointer, for generating a read address in the memory circuit MEM. The read address generating circuit 123 includes an increment circuit 123b and a remainder calculating circuit 123a both connected between the counter circuit 121 and the memory circuit MEM, and the counter circuit 121. The increment circuit 123b adds one to another output state value of the counter circuit 121 and outputting the result of the addition, and the remainder calculating circuit 123a generates and outputs a remainder obtained by dividing the output state value of the increment circuit 123b by four.

At this point, the state value is divided by four in each of the remainder calculating circuits 122a and 123a because the number of the registers constituting the shift register is herein four. Therefore, when the number of the registers is n (wherein n is a natural number), the state value is divided by n, i.e., the number of the registers.

The register COUNT(121a) can have any bit width as far as the number of the registers included in the shift register can be expressed.

Now, the behavior of the partial circuit of FIG. 9 will be described. When the initial state value of the register COUNT(121a) is 0, the output state value of the counter circuit 121 of FIG. 9 is changed from 0 successively to 1, 2, 3, 4, 5, 6, etc. at each rise of a clock CLK.

The state value output by the write address generating circuit 122 is equal to a remainder obtained by dividing the output state value of the counter circuit 121 by four by the remainder calculating circuit 122a, and hence is changed from 0 successively to 1, 2, 3, 0, 1, 2, etc.

The state value output by the read address generating circuit 123 is equal to a remainder obtained by adding one to the output state value of the counter circuit 121 by the increment circuit 123b and dividing the result of the addition by four by the remainder calculating circuit 123a, and hence is changed from 1 successively to 2, 3, 0, 1, 2, 3, etc.

These state values are used as indices of the addresses in the memory circuit MEM. Specifically, a reference address of the memory circuit MEM is indicated as "a leading address of the memory circuit MEM+a state value of each address generating circuit", which is herein represented as MEM[state value]. For example, MEM[0] is an address for referring to a first word of the memory circuit MEM, namely, one leading word of the memory circuit MEM.

In this embodiment, the number of the registers included in the shift register is four. However, when the number of the registers is n (wherein n is a natural number), the word number of the memory circuit MEM can be n or larger, and the bit width of the register COUNT(121a) can be a sufficient width for executing the simulation.

Particularly in the case where the number of the registers included in the shift register is $2^n$ (wherein n is a natural number), there is no need to provide the remainder calculating circuits 122a and 123a owing to the characteristic of the logic circuit. In such a case, the word number of the memory circuit MEM is $2^n$, and hence, the bit width of the register COUNT(121a) included in the counter circuit 121 can be n.

As is shown in FIG. 9, when the number of the registers included in the shift register is four, n is 2. Therefore, the word number of the memory circuit MEM is four, and the bit width of the register COUNT(121a) for holding the count value of the counter circuit 121 is two bits. In this case, the count value generated by the counter circuit 121 is changed from 0 successively to 1, 2, 3, 0, 1, 2, 3, etc.

The state value output by the write address generating circuit 122 is the same as the count value of the counter circuit 121 because the write address generating circuit 122 has the same configuration as the counter circuit 121 when the remainder calculating circuit 122a is not provided.

The state value of the read address generating circuit 123 is generated by adding one to the output state value of the counter circuit 121 by the increment circuit 123b. Therefore, when the state value of the counter circuit 121 is 3 and one is added to this state value, the result of the addition overflows to be 0. As a result, the state value of the read address generating circuit 123 is changed from 1 successively to 2, 3, 0, 1, 2, 3, etc.

Accordingly, only when the number of the registers included in the partial circuit is $2^n$, there is no need to provide the remainder calculating circuits 122a and 123a by setting the bit width of the register COUNT(121a) of the counter circuit 121 at n. This is because there is no remainder in such a case since the number of the state values generated by the counter circuit 121 accords with the number of the registers.

FIG. 10(a) shows an example of the partial circuit of FIG. 9 including the remainder calculating circuits 122a and 123a, described by using the Verilog HDL as the hardware description language. In FIG. 10(a), % used in the hardware description language indicates a remainder calculating element. FIG. 10(b) shows an example of the partial circuit of FIG. 9 excluding the remainder calculating circuits 122a and 123a, described by using the hardware description language.

In the above description, no combinational circuit is interposed between the registers for the sake of simplification, but a circuit including a combinational circuit interposed between the registers can be similarly converted. However, each register included in the partial circuit including the shift register is required to have one input and one output.

Figure 11:
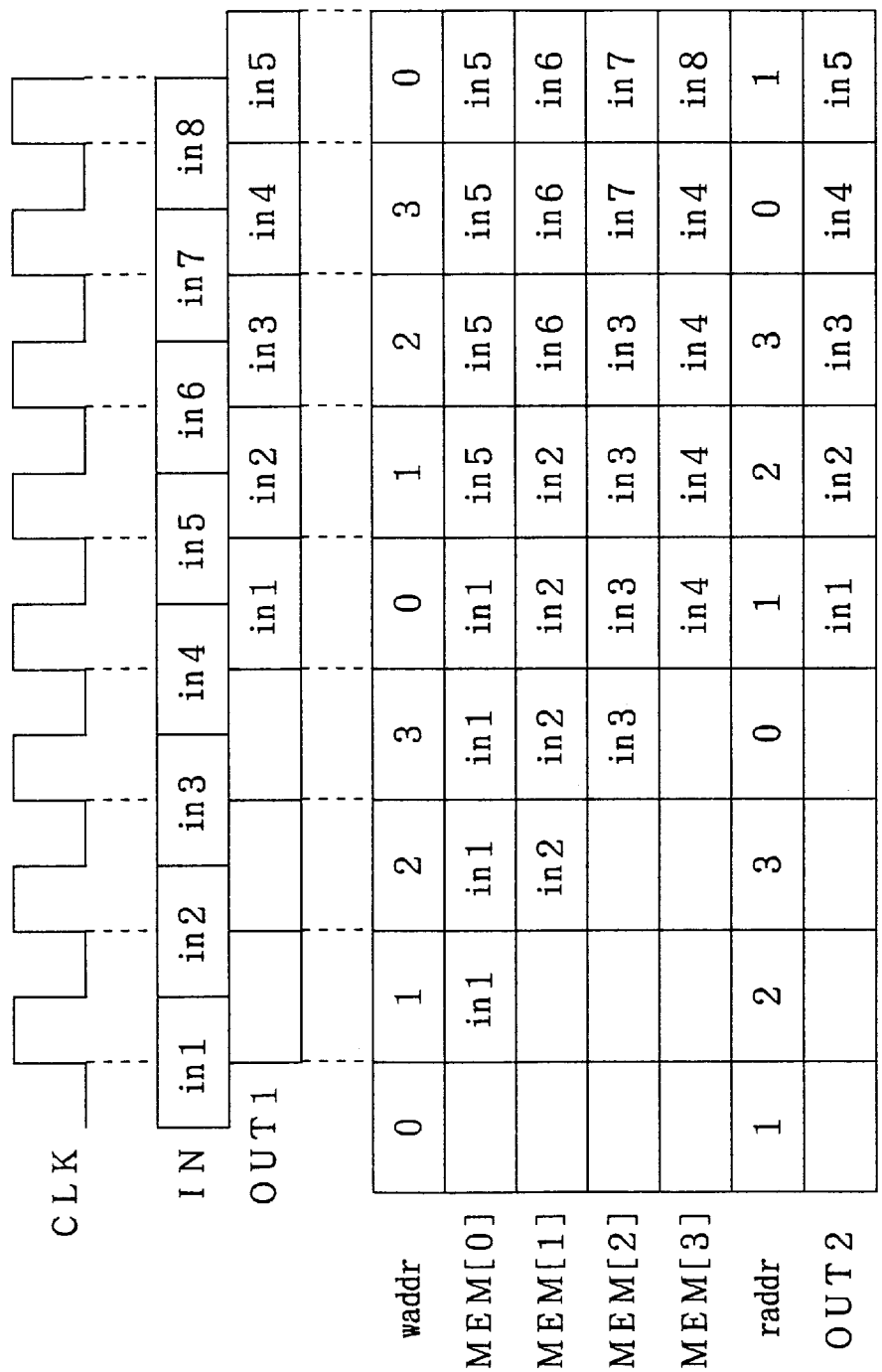
FIG. 11 is a timing chart for showing input/output operation timing of a shift register circuit obtained before conversion and of a memory circuit obtained after the conversion, in the simulator of the second embodiment.

Now, description will be given on the original partial circuit of FIG. 8(a) being operated in the same manner as the partial circuit of FIG. 9 obtained through the conversion, with reference to a timing chart of FIG. 11. In FIG. 11, CLK indicates the input pattern of a clock CLK, IN indicates the input pattern to the input pin IN of the original partial circuit, and OUT1 indicates the output pattern output to the output pin OUT of the original partial circuit. Also, "waddr" indicates a state value output by the write address generating circuit 122 of the converted partial circuit, MEM[0] indicates a state value held in the first word of the memory circuit MEM of the converted partial circuit, MEM[1] indicates a state value held in the second word of the memory circuit MEM of the converted partial circuit, MEM[2] indicates a state value held in the third word of the memory circuit MEM of the converted partial circuit, and MEM[3] indicates a state value held in the fourth word of the memory circuit MEM of the converted partial circuit. Furthermore, "raddr" indicates a state value output by the read address generating circuit 123, and OUT2 indicates the output pattern output to the output pin OUT of the converted partial circuit.

As is shown in FIG. 11, the output pattern OUT1 of the original partial circuit and the output pattern OUT2 of the converted partial circuit are the same at the same clock CLK timing.

Moreover, the program list, described by using the hardware description language, of the original partial circuit shown in FIG. 8(b) is compared with the program list, described by using the hardware description language, of the converted partial circuit shown in FIG. 10(a). In the original partial circuit of FIG. 8(b), the number of required data transfers is equal to the number of steps in the shift register including the registers A through D, except for the transfer to the last output pin OUT. In contrast, in the converted partial circuit of FIG. 10(a), the number of required data transfers is four regardless of the number of the steps in the shift register, except for the transfer to the last output pin OUT. In particular, when the number of the registers included in the shift register is $2^n$ as is shown in FIG. 10(b), the number of required data transfers is merely three, except for the transfer to the last output pin OUT.

As described so far, the converted logic circuit can be simulated at a higher speed than the original logic circuit, and hence, the function/behavior of the logic circuit can be rapidly verified. As a result, the time required for the design of the logic circuit can be shortened.

(Embodiment 3)

A third embodiment of the invention will now be described with reference to the accompanying drawings.

Figure 12:
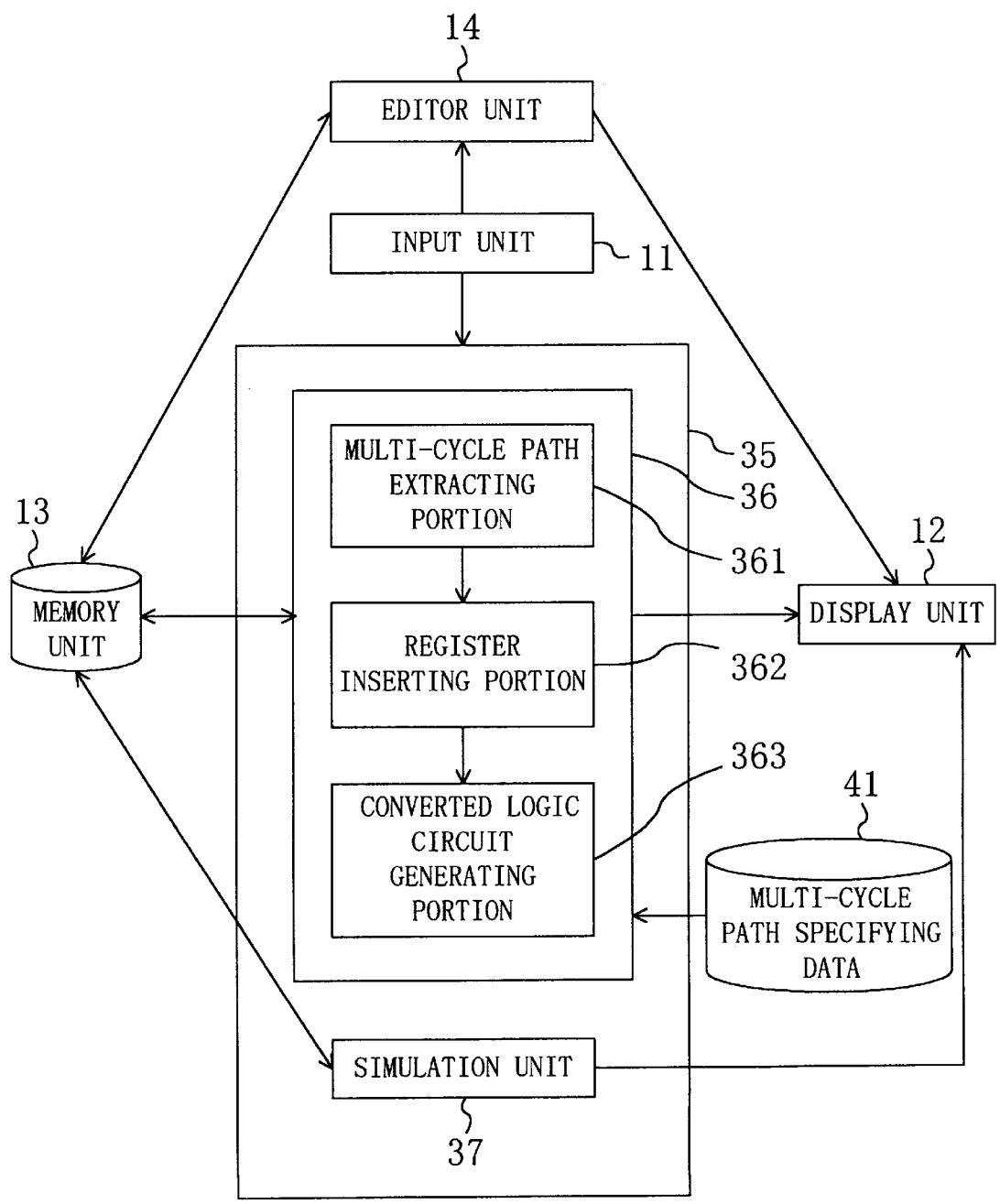
FIG. 12 is a diagram for showing the block configuration of a simulator according to a third embodiment of the invention.

FIG. 12 is a block diagram of a simulator according to the third embodiment. In FIG. 12, a reference numeral 11 denotes an input unit for externally inputting desired data, a reference numeral 12 denotes a display unit for displaying various data, a reference numeral 13 denotes a memory unit for storing design data and the like of a logic circuit, a reference numeral 14 denotes an editor unit having a function to describe, in the display unit 12, the function/behavior of the logic circuit to be simulated including a multi-cycle path operated in accordance with plural clock cycles by using a hardware description language or a function diagram, a function to store the described data of the logic circuit in the memory unit 13 as logic circuit data, and a function to read the logic circuit data from the memory unit 13 and display the read data in the display unit 12, a reference numeral 35 denotes a simulation executing unit including a conversion unit 36 working as converted logic circuit generating means and a simulation unit 37 working as simulation means, and a reference numeral 41 denotes multi-cycle path specifying data for specifying which portion of the logic circuit has a multi-cycle path of how many cycles.

The conversion unit 36 includes a multi-cycle path extracting portion 361, a register inserting portion 362 and a converted logic circuit generating portion 363.

The multi-cycle path extracting portion 361 has a function to detect description errors in the logic circuit data read from the memory unit 13 and described by the editor unit 14, and a function to read the multi-cycle path specifying data 41 and extract a multi-cycle path portion from the logic circuit. At this point, a description error can be a grammatical error, an inequality error in a bit width, an error of uncompleted description, and the like.

The register inserting portion 362 has a function to insert a register for adjusting timing into the multi-cycle path portion extracted by the multi-cycle path extracting portion 361, and a function to display data on the insertion of the register in the display unit 12.

The converted logic circuit generating portion 363 has a function to generate a converted logic circuit from the logic circuit into which the register has been inserted by the register inserting portion 362, and a function to store logic circuit data of the converted logic circuit in the memory unit 13.

The simulation unit 37 has a function to conduct a simulation on the converted logic circuit generated by the conversion unit 36, by using a 0-delay model where a delay time of data transfer is not considered, with the logic circuit data of the converted logic circuit received from the memory unit 13, a function to display the result of the simulation in the display unit 12, and a function to store the result of the simulation in the memory unit 13.

The simulator of this embodiment further includes simulation substituting means for substituting the result of the simulation of the converted logic circuit for a simulation of the function/behavior of the logic circuit to be simulated. However, the result of the simulation of the converted logic circuit can be simply mapped in the simulation result of the original logic circuit in this embodiment, and hence, the simulation substituting means is not shown in the drawing. Also, the simulation system adopted by the simulation unit 37 can be the event-driven system or the cycle-based system.

Now, a simulation method by using the simulator having the aforementioned configuration will be described.

Figure 13:
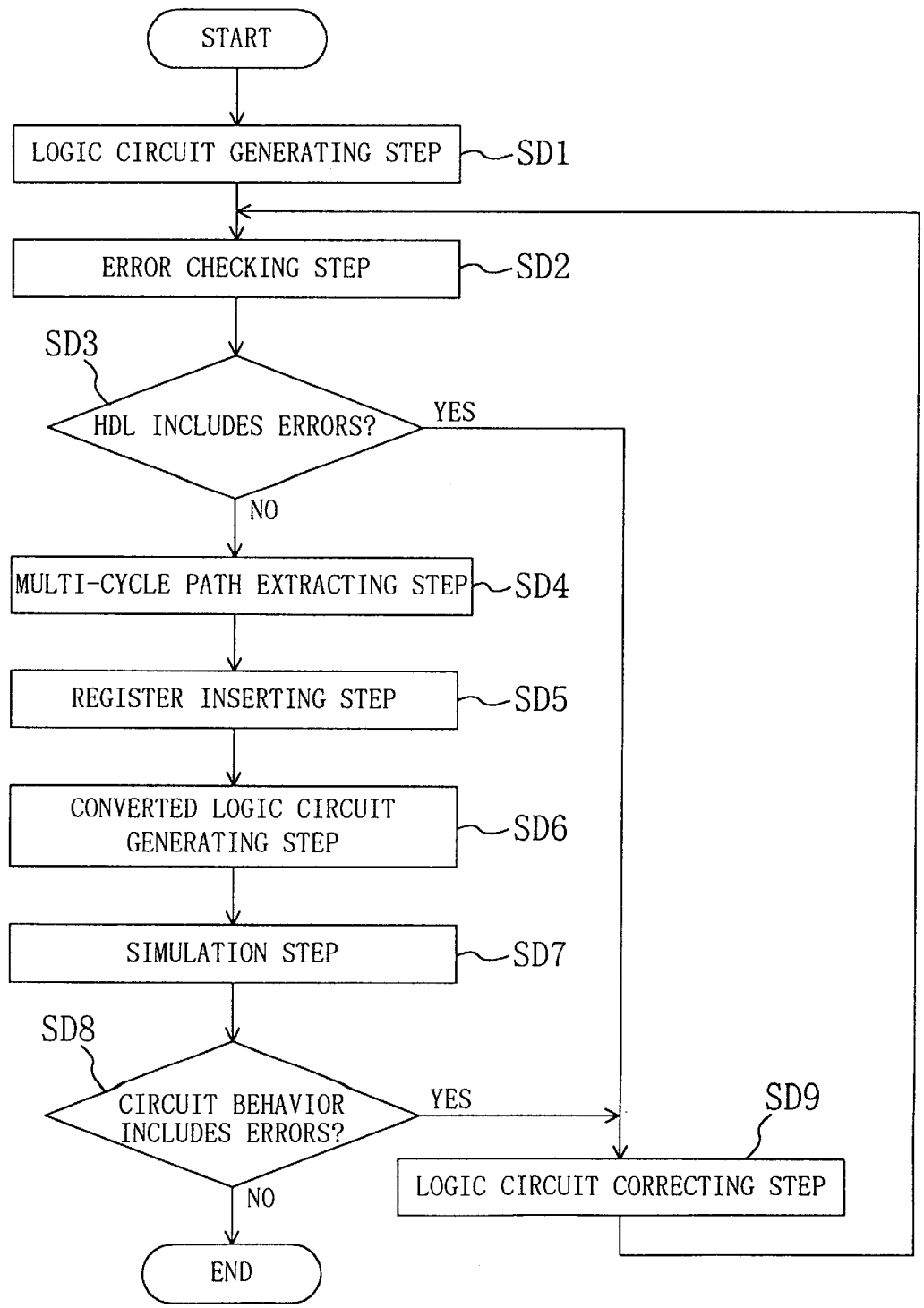
FIG. 13 is a flowchart for showing a simulation method using the simulator of the third embodiment.

FIG. 13 is a flowchart for showing the simulation method by using the simulator of the third embodiment.

First, as is shown in FIG. 13, in a logic circuit generating step SD1, the editor unit 14 of FIG. 12 describes the function/behavior of the logic circuit to be simulated by using the hardware description language or the function diagram, thereby generating the logic circuit data of the logic circuit.

Next, in an error checking step SD2, the multi-cycle path extracting portion 361 detects description errors in the logic circuit data of the logic circuit generated in the logic circuit generating step SD1.

Then, in a description error judging step SD3, it is determined whether or not the logic circuit data includes any error, and when there is no error, the procedure proceeds to a multi-cycle path extracting step SD4. When there is an error, the procedure proceeds to a logic circuit correcting step SD9, where the logic circuit or the logic circuit data thereof is corrected in the editor unit 14, and the procedure returns to the error checking step SD2.

Subsequently, in the multi-cycle path extracting step SD4, the multi-cycle path extracting portion 361 specifies and extracts a multi-cycle path portion in the logic circuit by using the multi-cycle path specifying data 41.

Next, in a register inserting step SD5, the register inserting portion 362 inserts registers in a number necessary for synchronization into the multi-cycle path portion extracted by the multi-cycle path extracting portion 361. Specifically, in the case where the extracted multi-cycle path portion is a register, when the register is a multi-cycle path of two clocks, one register is inserted, when the register is a multi-cycle path of three clocks, two registers. are inserted, and when the register is a multi-cycle path of n clocks, (n−1) registers are inserted (wherein n is an integer larger than 1).

Then, in a converted logic circuit generating step SD6, the converted logic circuit generating portion 363 generates a converted logic circuit from the logic circuit in which the registers necessary for the synchronization have been inserted into the multi-cycle path portion by the register inserting portion 362.

Next, in a simulation step SD7, the simulation unit 37 performs a simulation on the converted logic circuit generated by the converted logic circuit generating portion 363, thereby verifying the function of the converted logic circuit.

Then, in a behavior error judging step SD8, it is determined whether or not the behavior of the converted logic circuit includes any error, and when there is no error, the simulation is completed. When there is an error, the converted logic circuit or the logic circuit data thereof is corrected in the logic circuit correcting step SD9, and the procedure returns to the error checking step SD2.

When the logic circuit has a description error, or when the function/behavior of the converted logic circuit includes an error, the procedures in the steps SD2 through SD9 are successively repeated.

Test patterns for the simulation used in the simulation step SD7 are assumed to include no error. If the test patterns include any error, the test patterns are required to be corrected.

Furthermore, as described with regard to the configuration of the simulator of this embodiment, description of a simulation substituting step of substituting the simulation result of the converted logic circuit for the simulation of the function/behavior of the logic circuit to be simulated is herein omitted.

Now, the multi-cycle path in the logic circuit will be described by way of examples.

Figure 14:
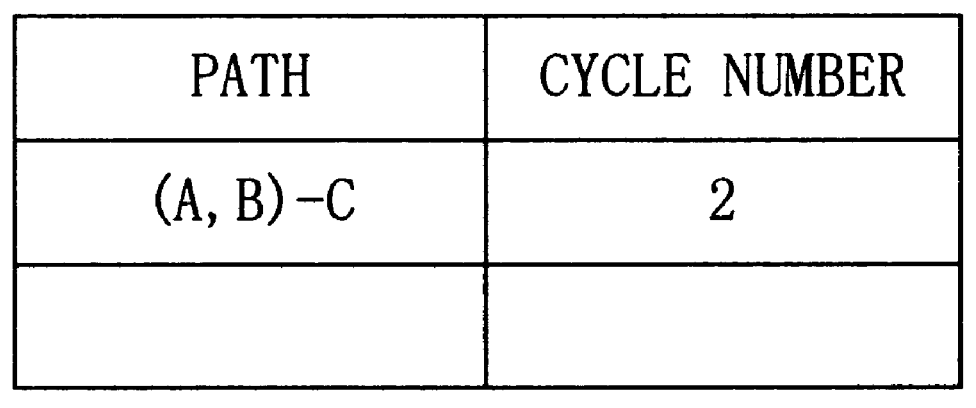

FIG. 14 illustrates a table where the multi-cycle path specifying data are registered. In FIG. 14, "Path" in the left column indicates a multi-cycle path, and the listed example means a path from registers A and B to a register C being a multi-cycle path. Also, "Cycle number" on the right column indicates the number of cycles of the corresponding path, and the listed example means the path is of two clock cycles.

FIGS. 15(*a*) through 15(*d*) illustrate the conversion of the multi-cycle path in the logic circuit to be simulated, wherein FIG. 15(*a*) shows a combinational partial circuit before the conversion extracted by the multi-cycle path extracting portion and FIG. 15(*c*) shows a combinational partial circuit obtained after the conversion. In FIG. 15(a), A, B and C indicate registers for holding input data in synchronization with a clock CLK, and a reference numeral 51 denotes a combinational partial circuit including an adder. In FIG. 15(c), "temp" indicates a register for synchronization matching inserted by the register inserting portion 362 into the multi-cycle path of two clock cycles. A program list of FIG. 15(b), described by using the hardware description language, corresponds to the combinational partial circuit before the conversion shown in FIG. 15(a), and a program list of FIG. 15(d), described by using the hardware description language, corresponds to the combinational partial circuit after the conversion shown in FIG. 15(c). In this case, the Verilog HDL is used as the hardware description language.

In this embodiment, the register temp for synchronization matching is inserted between the combinational partial circuit 51 and the register C as is shown in FIG. 15(c). However, the inserted register temp can follow or can be followed by the combinational partial circuit 51. When the register temp is followed by the combinational partial circuit 51, two registers for the synchronization matching are inserted; one between the register A and the combinational partial circuit 51 and another between the register B and the combinational partial circuit 51.

When the registers required for the synchronization of the multi-cycle path are thus inserted, the operation of the multi-cycle path can be correctly simulated. As a result, the function/behavior of the logic circuit can be definitely verified.

The multi-cycle path specifying data can be manually input by a designer. Alternatively, when logic circuit is logically generated so as to obtain timing data between registers in the logic circuit, if the obtained timing is longer than a clock cycle, the corresponding path is a multi-cycle path. Therefore, the number of cycles of the path can be obtained with ease. Thus, the multi-cycle path specifying data can be automatically generated.

What is claimed is:

1. A simulator for use in a functional and behavioral simulation of a logic circuit, comprising:
    converted logic circuit generating means for generating a converted logic circuit by converting a logic circuit to be simulated so as to decrease a number of data transfers executed in said logic circuit without changing an output operation timing of said logic circuit;
    simulation means for performing a functional and behavioral simulation on said converted logic circuit generated by said converted logic circuit generating means; and
    simulation substituting means for substituting a result of said simulation obtained by said simulation means for a functional and behavioral simulation of said logic circuit.

2. The simulator of claim 1,
    wherein said converted logic circuit generating means includes:
        a circuit dividing portion for dividing said logic circuit into plural combinational partial circuits each interposed between one register and an input pin, an output pin, a bisectional pin or another register; and
        a circuit converting portion for modifying allocation of registers so as to allocate each of said combinational partial circuits to a common register instead of said one register.

3. The simulator of claim 1,
    wherein said converted logic circuit generating means includes:
        a circuit dividing portion for dividing said logic circuit into plural combinational partial circuits each interposed between one register and an input pin, an output pin, a bidirectional pin or another register;
        a combinational partial circuit extracting portion for extracting, from said plural combinational partial circuits, a specific combinational partial circuit which has two or more inputs, has inputs larger in number than an output and is connected with plural registers having a same function with one another at its inputs; and
        a register allocation modifying portion for deleting said plural registers connected with said specific combinational partial circuit at its inputs and for inserting a register having the same function as said plural registers to be connected with said output of said specific combinational partial circuit.

4. The simulator of claim 1,
    wherein said logic circuit includes plural registers, and said converted logic circuit generating means includes:
        a partial circuit extracting portion for extracting, from said logic circuit, a partial circuit including a shift register consisting of said plural registers; and
        a circuit converting portion for converting said partial circuit extracted by said partial circuit extracting portion into a memory circuit including an input state value pointer for specifying a holding place for holding an input state value of said partial circuit, an output state value pointer for specifying a holding place for holding an output state value of said partial circuit and a state value holding portion for holding a state value of each of said registers of said shift register included in said partial circuit.

5. The simulator of claim 1,
    wherein said logic circuit includes plural registers, and said converted logic circuit generating means includes:
        a partial circuit extracting portion for extracting, from said logic circuit, a partial circuit including a shift register consisting of said plural registers; and
        a circuit converting portion for converting said partial circuit extracted by said partial circuit extracting portion into a memory circuit provided with a read/write control circuit which includes a memory circuit for storing an input/output state of said partial circuit, a write address generating circuit for generating a write address in said memory circuit and a read address generating circuit for generating a read address in said memory circuit.

6. The simulator of claim 5,
    wherein said write address generating circuit is a counter circuit, and said read address generating circuit includes said counter circuit and an increment circuit.

7. The simulator of claim 6,
    wherein said write address generating circuit and said read address generating circuit respectively include remainder calculating circuits.

8. A simulator for use in a functional and behavioral simulation of a logic circuit including a multi-cycle path operated in accordance with plural clock cycles by using a 0-delay model where a delay time of operation is not considered, comprising:
    converted logic circuit generating means for generating a converted logic circuit by converting said logic circuit through insertion of a register into said multi-cycle path included in said logic circuit to be simulated;
    simulation means for performing a functional and behavioral simulation on said converted logic circuit generated by said converted logic circuit generating means; and simulation substituting means for substituting a result of said simulation obtained by said simulation means for a functional and behavioral simulation of said logic circuit.

9. The simulator of claim 8, wherein said converted logic circuit generating means includes:

a multi-cycle path extracting portion for receiving specifying data for specifying said multi-cycle path and extracting said multi-cycle path included in said logic circuit; and a register inserting portion for inserting a register into said multi-cycle path extracted by said multi-cycle path extracting portion so as to operate said multi-cycle path in accordance with a number of clock cycles specified by said specifying data.

10. A simulation method for use in a functional and behavioral simulation of a logic circuit, comprising:

a circuit dividing step of dividing said logic circuit into plural combinational partial circuits each interposed between one register and an input pin, an output pin, a bidirectional pin or another register;

a circuit converting step of modifying allocation of registers so as to allocate each of said plural combinational partial circuits to a common register instead of said one register without changing an output operation timing of said logic circuit;

a converted logic circuit generating step of generating a converted logic circuit by converting said logic circuit in which the allocation of registers has been modified in said circuit converting step;

a simulation step of performing a functional and behavioral simulation on said converted logic circuit generated in said converted logic circuit generating step; and a simulation substituting step of substituting a result of said simulation obtained in said simulation step for a functional and behavioral simulation of said logic circuit.

11. A simulation method for use in a functional and behavioral simulation of a logic circuit, comprising:

a circuit dividing step of dividing said logic circuit into plural combinational partial circuits each interposed between one register and an input pin, an output pin, a bidirectional pin or another register;

a combinational partial circuit extracting step of extracting, from said plural combinational partial circuits, a specific combinational partial circuit which has two or more inputs, has inputs larger in number than an output and is connected with plural registers having the same function at its inputs;

a register allocation modifying step of deleting said plural registers connected with said inputs of said specific combinational partial circuit and for inserting a register having the same function as said plural registers to be connected with said output of said specific combinational partial circuit;

a converted logic circuit generating step of generating a converted logic circuit by converting said logic circuit in which the allocation of registers has been modified in said register allocation modifying step;

a simulation step of performing a functional and behavioral simulation on said converted logic circuit generated in said converted logic circuit generating step; and a simulation substituting step of substituting a result of said simulation obtained in said simulation step for a functional and behavioral simulation of said logic circuit.

12. A simulation method for use in a functional and behavioral simulation of a logic circuit including a shift register consisting of plural registers, comprising:

a partial circuit extracting step of extracting, from said logic circuit to be simulated, a partial circuit including said shift register consisting of said plural registers, a circuit converting step of converting said partial circuit extracted in said partial circuit extracting step into a memory circuit provided with a read/write control circuit which includes a memory circuit for storing an input/output state of said partial circuit, a write address generating circuit for generating a write address in said memory circuit and a read address generating circuit for generating a read address in said memory circuit;

a converted logic circuit generating step of generating a converted logic circuit by converting said logic circuit on the basis of said memory circuit provided with a read/write control circuit obtained in said circuit converting step;

a simulation step of performing a functional and behavioral simulation on said converted logic circuit generated in said converted logic circuit generating step; and a simulation substituting step of substituting a result of said simulation obtained in said simulation step for a functional and behavioral simulation of said logic circuit.

13. A simulation method for use in a functional and behavioral simulation of a logic circuit including a multi-cycle path operated in accordance with plural clock cycles by using a 0-delay model where a delay time of operation is not considered, comprising:

a multi-cycle path extracting step of extracting said multi-cycle path of said logic circuit to be simulated by using specifying data for specifying said multi-cycle path;

a register inserting step of inserting, into said multi-cycle path extracted in said multi-cycle path extracting step, registers in a number necessary for operating said multi-cycle path in accordance with a number of clock cycles specified by said specifying data;

a converted logic circuit generating step of generating a converted logic circuit by converting said logic circuit on the basis of said multi-cycle path into which said registers have been inserted in said register inserting step;

a simulation step of performing a functional and behavioral simulation on said converted logic circuit generated in said converted logic circuit generating step; and a simulation substituting step of substituting a result of said simulation obtained in said simulation step for a functional and behavioral simulation of said logic circuit.

* * * * *